(12) United States Patent
Ireland

(10) Patent No.: US 9,992,894 B2
(45) Date of Patent: Jun. 5, 2018

(54) DOCKING STATION FOR A MOBILE ROBOT

(71) Applicant: Dyson Technology Limited, Wiltshire (GB)

(72) Inventor: Simon Edward Ireland, Tonbridge (GB)

(73) Assignee: Dyson Technology Limited, Malmesbury, Wiltshire (GB)

( * ) Notice: Subject to any disclaimer, the term of this patent is extended or adjusted under 35 U.S.C. 154(b) by 0 days. days.

(21) Appl. No.: 14/161,211

(22) Filed: Jan. 22, 2014

(65) Prior Publication Data

US 2014/0204510 A1    Jul. 24, 2014

(30) Foreign Application Priority Data

Jan. 22, 2013 (GB) .................................. 1301108.5

(51) Int. Cl.
*H02J 7/00* (2006.01)
*H05K 7/00* (2006.01)
*A47L 9/28* (2006.01)

(52) U.S. Cl.
CPC .............. *H05K 7/00* (2013.01); *A47L 9/2873* (2013.01); *A47L 2201/02* (2013.01)

(58) Field of Classification Search
CPC .................................................... H02J 7/0027
USPC ........................................................ 320/115
See application file for complete search history.

(56) References Cited

U.S. PATENT DOCUMENTS 5,266,540 A * 11/1993 Menicagli ............. C01B 32/366
 210/694
7,966,112 B1 * 6/2011 Morris, Jr. .................... 701/29.4
8,138,624 B2 * 3/2012 Yeh .............................. 307/10.1
9,160,183 B2 * 10/2015 Paczkowski et al.
2005/0156562 A1 7/2005 Cohen et al.
2005/0191971 A1 * 9/2005 Boone ................. H04M 1/6016
 455/90.3
2005/0287038 A1 * 12/2005 Dubrovsky et al. ............ 422/63
2006/0145658 A1 * 7/2006 Wang ............................ 320/107
2006/0254861 A1 * 11/2006 Perrier et al. .................... 186/26
2007/0046254 A1 * 3/2007 Chen et al. ..................... 320/107
2007/0050937 A1 * 3/2007 Song et al. ...................... 15/319
2009/0315393 A1 * 12/2009 Yeh .............................. 307/10.1

(Continued)

FOREIGN PATENT DOCUMENTS

CN 2726134 9/2005
EP 2 540 205 1/2013

(Continued)

OTHER PUBLICATIONS

Search Report dated May 20, 2013, directed to GB Application No. 1301108.5; 1 page.

(Continued)

*Primary Examiner* — Suchin Parihar
(74) *Attorney, Agent, or Firm* — Morrison & Foerster LLP

(57) ABSTRACT

A docking station for a mobile robot including a first side portion and a second side portion and housing an electrical system having power input means. The power input means includes a first power input socket provided on the first side portion and a second power input socket provided on the second side portion. The two power input sockets allows a user flexibility in their choice of location for the docking station in an environment.

13 Claims, 16 Drawing Sheets

(56) References Cited

U.S. PATENT DOCUMENTS

| | | | |
|---|---|---|---|
| 2009/0315511 A1* | 12/2009 | Lai | 320/107 |
| 2009/0322282 A1* | 12/2009 | Chu | 320/109 |
| 2010/0012725 A1* | 1/2010 | Zemba et al. | 235/451 |
| 2010/0026239 A1* | 2/2010 | Li et al. | 320/109 |
| 2010/0090645 A1* | 4/2010 | Huang | 320/110 |
| 2010/0202627 A1* | 8/2010 | Gray | 381/77 |
| 2011/0006735 A1* | 1/2011 | Wu | G06F 1/1632 320/125 |
| 2011/0089891 A1* | 4/2011 | Pai | 320/107 |
| 2011/0234153 A1* | 9/2011 | Abramson | 320/107 |
| 2013/0006418 A1* | 1/2013 | Tian et al. | 700/245 |
| 2013/0036906 A1* | 2/2013 | Dunn | 95/70 |
| 2013/0134921 A1* | 5/2013 | Shen et al. | 320/101 |
| 2013/0335900 A1* | 12/2013 | Jang | 361/679.01 |
| 2014/0002010 A1* | 1/2014 | Paczkowski et al. | 320/107 |
| 2014/0055078 A1* | 2/2014 | Jing | 320/103 |
| 2014/0061273 A1* | 3/2014 | Bullivant | A45F 3/04 224/576 |
| 2014/0080337 A1* | 3/2014 | Lai | H01R 13/447 439/172 |
| 2014/0132205 A1* | 5/2014 | Paczkowski et al. | 320/107 |
| 2014/0191033 A1* | 7/2014 | Wojcik | G06K 7/082 235/449 |
| 2014/0194160 A1* | 7/2014 | Jing et al. | 455/557 |
| 2014/0203764 A1* | 7/2014 | Ireland | 320/107 |
| 2014/0203776 A1* | 7/2014 | Ireland et al. | 320/109 |
| 2014/0232328 A1* | 8/2014 | Pegg | 320/108 |
| 2014/0266026 A1* | 9/2014 | Dowd et al. | 320/108 |
| 2014/0283686 A1* | 9/2014 | Dunn | 95/78 |
| 2015/0000068 A1* | 1/2015 | Tsuboi | A47L 9/009 15/319 |
| 2015/0002088 A1* | 1/2015 | D'Agostino | H02J 7/025 320/108 |
| 2015/0091389 A1* | 4/2015 | Byrne et al. | 307/104 |
| 2015/0130406 A1* | 5/2015 | Jing | 320/108 |
| 2015/0134144 A1* | 5/2015 | Bron et al. | 701/2 |
| 2015/0158174 A1* | 6/2015 | Romanov et al. | 320/107 |
| 2015/0256021 A1* | 9/2015 | Kwon et al. | 320/108 |
| 2016/0268801 A1* | 9/2016 | Chong | H02J 1/00 |

FOREIGN PATENT DOCUMENTS

| | | |
|---|---|---|
| GB | 2 394 796 | 5/2004 |
| JP | 6-289976 | 10/1994 |
| JP | 7-170680 | 7/1995 |
| JP | 3107913 | 4/2005 |
| KR | 10-2007-0112909 | 11/2007 |

OTHER PUBLICATIONS

International Search Report and Written Opinion dated Mar. 25, 2014, directed to International Application No. PCT/GB2014/050067; 10 pages.

\* cited by examiner

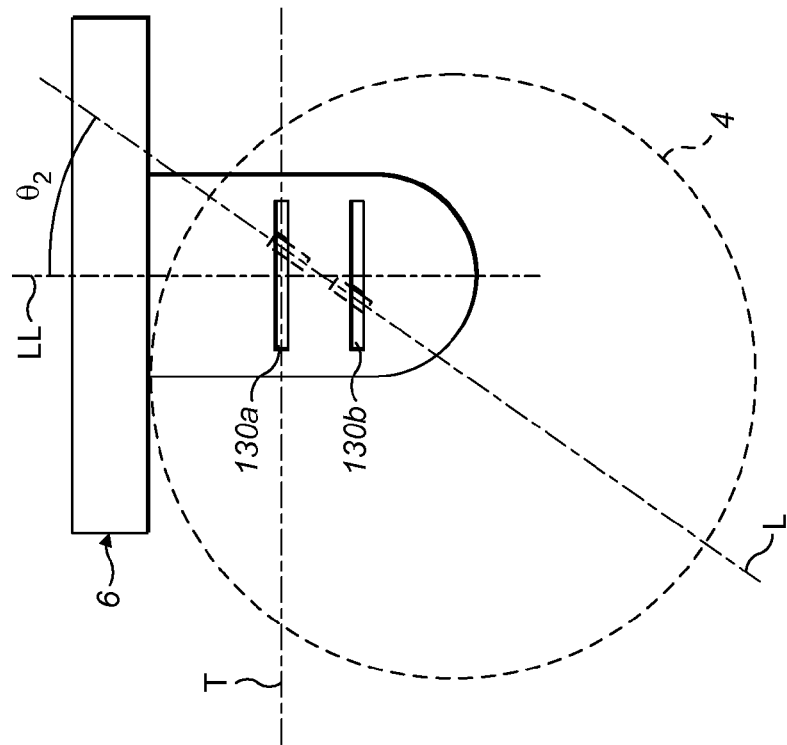
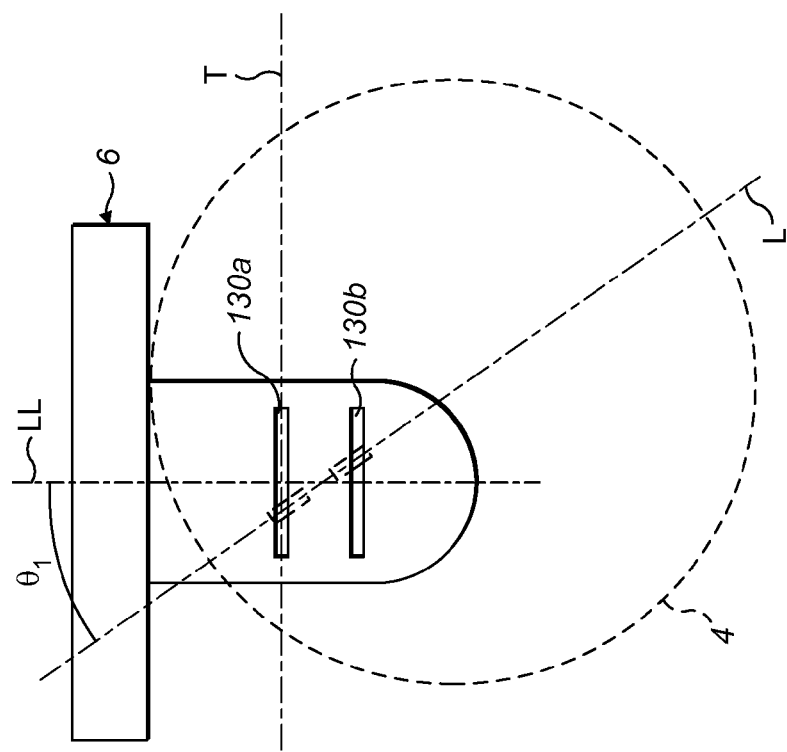

DOCKING STATION FOR A MOBILE ROBOT

REFERENCE TO RELATED APPLICATIONS

This application claims priority of United Kingdom Application No. 1301108.5, filed Jan. 22, 2013, the entire contents of which are incorporated herein by reference.

FIELD OF THE INVENTION

The invention relates to a docking station with which a mobile robot may cooperate in order to achieve certain functions, for example to replenish a rechargeable power source of the mobile robot. The invention also relates to a robotic system including a mobile robot and an associated docking station.

BACKGROUND OF THE INVENTION

It is becoming commonplace for mobile robots to be used around the home. For example, there are mobile robots that are designed specifically for vacuum cleaning and also ones which are designed for floor mopping. Also, mobile robots may be used in the home as mobile sentries. Such mobile sentries are equipped with suitable sensor suites to enable them to navigate a household, or office space, autonomously and detect abnormal conditions such as elevated heat levels or intruders into the area.

Common to such mobile robots is the requirement for them to move autonomously and so they are typically equipped with a rechargeable power source in the form of a battery pack in order to decouple the robot from dependence on wall-mounted power sockets. Typically the robot will be configured with an internal power monitoring routine so that it has a level of self-awareness relating to the level of electrical power that remains. When power levels are low, the robot is able to make its way back to a docking station with which the robot can connect in order to replenish its battery pack.

Mobile robot docking stations principally are provided with an electrical charging system having a set of contacts. The contacts are engageable with complementary contacts on the robot in order to provide an electrical charging current to the robot. However, docking stations may also have the facility to provide radio signals or other emissions in order to assist the robot in locating the docking station. Still further, in some robotic vacuum cleaner applications, the docking stations are equipped with dust extracting devices which are able to empty the dust bin of the mobile robot when it becomes full, thereby removing this frequent task from the user so as to increase the autonomy of the robot.

However, with such complexity come drawbacks. Often, mobile docking stations are large bulky items which need to be placed close to a power socket in a room of a home. Their physical presence has a significant visual impact and this detracts from the overriding principle of mobile robots that they should minimize impact on the user.

It is with these issues in mind that the invention has been devised.

SUMMARY OF THE INVENTION

In a first aspect the invention provides a docking station for a mobile robot, the docking station comprising a base portion that is locatable on a floor surface and a rear portion that is pivotable with respect to the base portion. The docking station is therefore portable and low profile which helps it be unobtrusive in an environment in which it is used. This is particularly important in a domestic dwelling for example where minimum clutter is usually desired. Also, the hinging action enables the docking station to be folded away into a compact stowed configuration if desired.

In order to provide an element of 'feel' to the user when folding and unfolding the docking station, a pivotable interface between the base portion and the rear portion may include a detent formation that releasably holds the rear portion in the upright position with respect to the base portion. Thus, the docking station is held in a deployed condition until a user asserts a predetermined force in order to perform a folding action.

Although in theory the rear portion could be pivotably mounted to the base portion in a variety of manners, in one embodiment the rear portion is snap-fitted to the pivot region of the base portion. Preferably, the pivot region includes pivot axles onto which sleeve members of the rear portion may be received so as to be able to slide relative to the pivot axles.

The base portion may include charging contact means for establishing an electrical connection to a mobile robot when it is docked on the docking station. The contact means may comprises first and second contacts adjacent to one another and they may be elongate in form which accommodates a range of lateral and angular misalignment between the robot and the docking station.

Although the power to the contacts means may be provided constantly, as a safety mechanism the docking station may include an activating mechanism that is triggered by the robot as it moves into a correct docking position. Although this may take the form of an electrical interlock involving a handshake protocol between the robot and the docking station through the contact means, in one embodiment the activating mechanism is mechanically actuated as takes the form of a movable lever that is pivoted about the base portion of the docking station. In a preferred embodiment the lever is pivoted about a rear portion of the base station and so is therefore able to move in cooperation with the folding action of the docking station.

The docking station may be placed against a wall of a room and in close enough proximity to an electrical mains power outlet to be coupled to it via a cable. In order to provide a user with flexibility in locating the docking station, in a further aspect the invention provides a docking station for a mobile robot, including a first side portion and a second side portion and housing an electrical system having power input means, wherein the power input means includes a first power input socket provided on the first side portion and a second power input socket provided on the second side portion.

In being able to choose to connect a power supply plug/jack to either side of the docking station, the user is providing with more flexibility about where they can locate the docking station. Although the side portions may be any face of the docking station, in one embodiment the first and second side portions are located on opposite sides of the docking station and, preferably, are located on a rearmost edge of the docking station which is locatable against a wall, in use.

Since there are at least two sockets, to guard against adverse affects of connecting a plug to each socket simultaneously, each socket may contain a switch that disables the other socket once a plug has been inserted.

The sockets are in electrical communication with a control module housed within the docking station which controls the flow of energy to electrical contact means of the docking station. In order for the mobile robot to receive power from the contact means, it is required to manoeuvre itself into a suitable position on the docking station. The ability of a mobile robot to manoeuvre itself into an acceptable position depends to a large extent on the effectiveness of its navigation system. In order to ensure that the mobile robot is robust in its ability to dock correctly with the docking stations, means are desirable to allow a degree of misalignment, both laterally and angularly, between the docking station and the mobile robot yet still achieve a successful docking such that the mobile robot is able to receive charging energy from the docking station. Therefore, in a further aspect, the invention provides a robotic system comprising a mobile robot including a body housing a rechargeable power source and first electrical contact means disposed on an underside of the body and a docking station including second electrical contact means, wherein the mobile robot is dockable on the docking station in order to charge the rechargeable power source. The first electrical contact means includes at least one electrical contact aligned on a first contact axis and the second electrical contact means includes at least one elongate contact, wherein when the robot is docked on the docking station such that electrical contact is established between the first electrical contact means and the electrical contact means, the at least one elongate contact extends in a direction that is transverse to the first contact axis.

Since the at least one electrical contact on the docking station is transverse to the at least one electrical contact on the robot, the system accommodates both lateral and angular misalignment between the mobile robot and the docking station.

To help the electrical contacts on the mobile robot to engage reliably with the electrical contacts on the docking station, the electrical contacts on the docking station may be resiliently mounted in the docking station, preferably mounted in the a base portion of the docking station so as to protrude at least partially from it.

The flow of electrical energy to the docking station contacts may be regulated by an activating mechanism that is movable by the robot as it adopts a docked position. The activating mechanism thereby serves as a safety feature to guard against a user inadvertently touching energised contacts.

The activating mechanism could take the form of an electrical interlock between the contacts of the docking station and the mobile robot, or a mechanical interlock. In one embodiment, the activating mechanism is a mechanical interlock and is in the form of a hinged lever that is optionally pivotably mounted to a rear portion of the docking station.

In a further aspect, the invention provides a docking station for providing a charging service to a mobile robot by providing a platform onto which the mobile robot may dock wherein the base portion is provided with an electrical contact that is elongate in form. In one embodiment a pair of elongate contacts are provided and these are linear in form. In one embodiment the elongate contacts are formed from nickel coated brass and are approximately 60 mm in length and approximately 5 mm wide. In essence the contacts must be longer than they are wide and the precise dimensions will be determined largely by the dimensions of the base portion on which the contacts are installed.

In an alternative embodiment the elongate contacts may be arcuate and may be dissimilar in length.

It should be appreciated that preferred and/or optional features of either of the abovementioned aspects of the invention may be combined with any of the other aspects of the invention.

BRIEF DESCRIPTION OF THE DRAWINGS

In order that the invention may be more readily understood, embodiments will now be described by way of example only with reference to the accompanying drawings, in which:

FIG. 8b is a section along the line ZZ-ZZ in FIG. 8a and FIG. 8c is a section along the line Z-Z in FIG. 8a;

FIG. 9b is a section along the line XX-XX in FIG. 9a and FIG. 9c is a section along the line X-X in FIG. 9a;

FIGS. 16a and 16b are schematic views like that in FIG. 13 but which show the robot in extreme angular docking positions on the docking station.

DETAILED DESCRIPTION OF THE INVENTION

Figure 1:
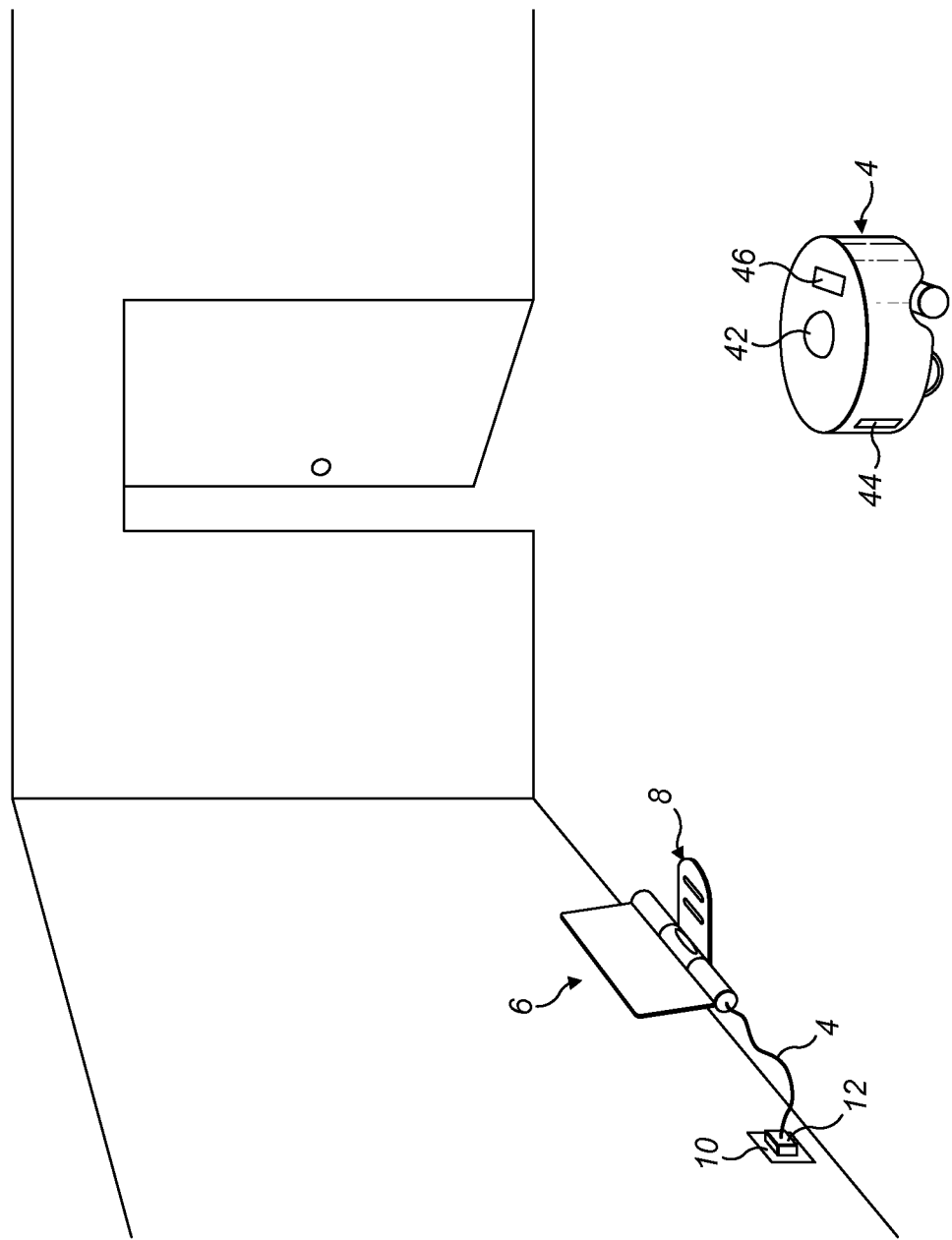
FIG. 1 is a perspective view of a room in which is located an exemplary robotic system comprising a mobile robot and a docking station in accordance with the invention.

With reference to FIG. 1 a robotic system 2 includes a mobile robot 4 and an associated docking station 6. In this embodiment, the mobile robot 4 is shown in the context of a vacuum cleaning robot although it should be appreciated that this is not essential to the invention and that the invention is applicable to any mobile robot, in a domestic setting or otherwise. The mobile robot 4 is autonomous and includes sufficient processing and sensing capability that enables the robot to navigate around the room, with the aid of a suitable on board navigation system, cleaning the floor as it goes.

The mobile robot 4 is powered by an rechargeable power source in the form of an internal battery pack (not shown in FIG. 1). Such a battery pack is generally known in the art and may be composed of a plurality of cells of a variety of cell chemistries. Cell chemistries in the lithium-ion family are currently preferred due to their high power density, low charge loss and lack of memory effect, although other cell chemistries such as nickel metal hydride and nickel cadmium are also acceptable.

The robot 4 is dockable with the docking station 6 so that it is able to recharge its battery pack when the battery pack nears a depleted state. The precise way in which the robot is able to locate the docking station and dock with it does not form part of the invention and so will not be described in further detail here.

The docking station 6 is shown in FIG. 1 positioned against a wall of the room. The docking station 6 includes electrical contact means 8 by which means the docking station 6 is able to offer charging energy to the robot 4 once it is in a docked position, as will be described. The docking station 6 is attached to a mains electrical wall outlet 10 via a power supply 12 and cable 14 and, in this way, a source of power is provided to the electrical contact means 8 of the docking station 6.

Figure 2:
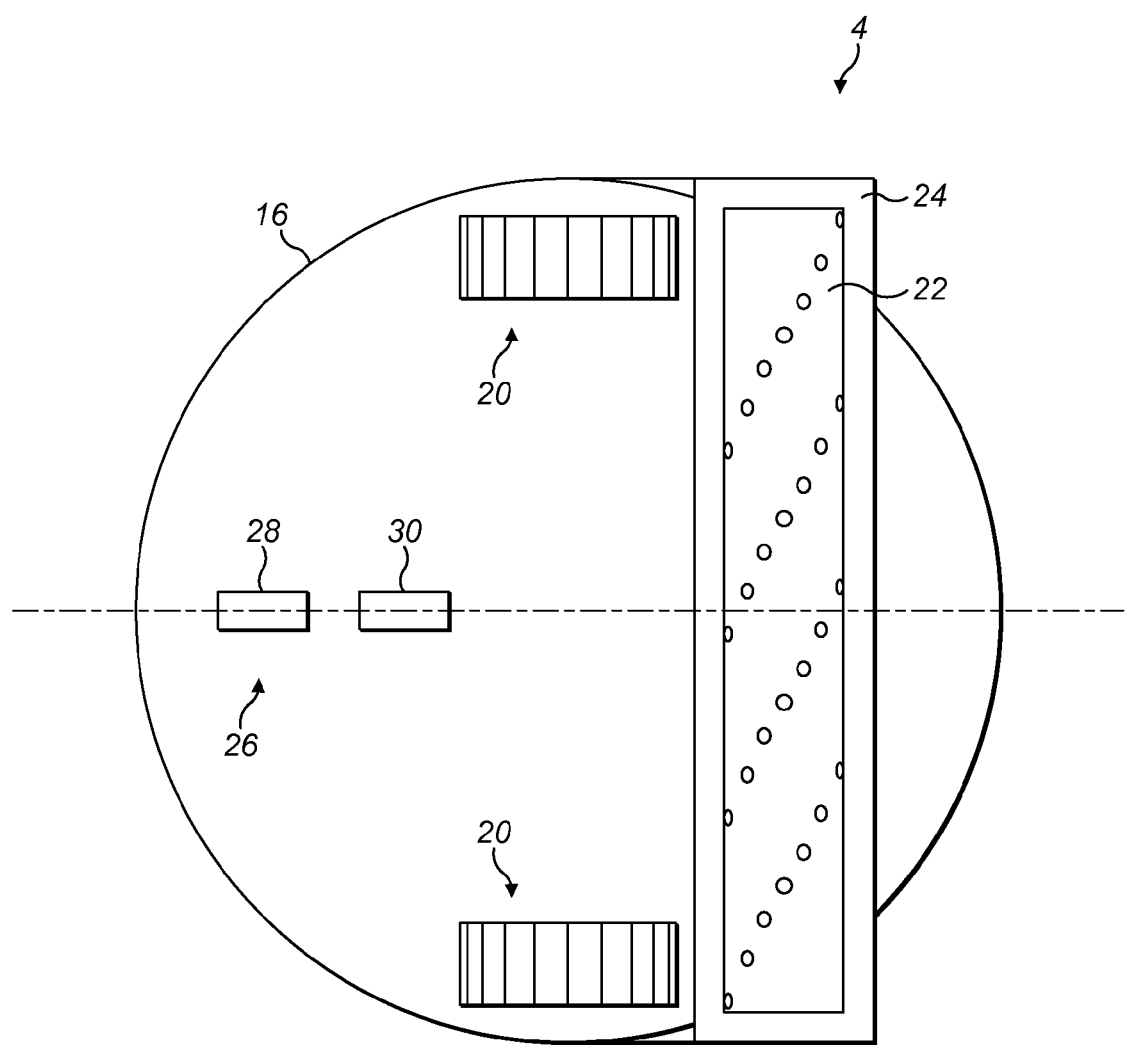
FIG. 2 is a schematic view of the mobile robot, from underneath, illustrating the layout of its components.

The robot 4 will now be described in more detail with reference also to FIGS. 2 and 3. In this embodiment, the robot 4 includes a main body 16 which is substantially cylindrical in form and has a height in the region of approximately 15 to 20 centimeters so that the robot 4 can move under low objects; chairs and tables for example. In order for the robot to move on a surface, the robot 4 includes a traction means 20. In this embodiment, the traction means 20 is in the form of a pair of wheels, although other solutions such as tracks or legs are feasible. The wheels 20 are located on opposite sides of the main body 16 and are operable independently to enable the robot 4 to be driven in forward and reverse directions, to follow a curved path towards the left or right, or to turn on the spot in either direction depending on the speed and rotation direction of the wheels. Such an arrangement is common in mobile robot applications and so it will not be described in further detail here. However, it should be appreciated that the specific shape of the main body 16 is exemplary and, accordingly, the skilled person would understand that the main body 16 could take on other forms.

In order to clean the floor surface the robot also includes a brush bar 22 that is housed in a brush bar housing 24. The brush bar 22 extends across the body 16 of the robot 4 laterally and is operable to rotate in order to agitate dirt from the adjacent surface. Although not shown in FIGS. 1 and 2, it should be appreciated that the robot 4 also includes a suitable vacuum generator in the form of a motor and fan unit and a dirt bin into which dirt that is lifted from the floor is collected. The precise configuration of these components is not essential to the inventive concept so further detail is omitted.

The underside of the main body 16 also includes electrical contact means 26. In the embodiment shown, the electrical contact means 26 comprises first and second electrical contacts 28, 30 that are supported on the underside of the robot body 16. Each of the first and second contacts 28, 30 are mounted in an aligned configuration. Specifically, each contact 28, 30 is aligned with a longitudinal axis L of the robot 4 and are spaced along the axis. The contacts are operable to connect to the electrical contact means 8 on the docking station 6, as will be described. Although not shown in the diagram, the electrical contacts 28, 30 are connected to the electrical system of the robot 4 so that electrical energy provided at the contacts is supplied to the rechargable battery pack of the robot 4.

Figure 3:
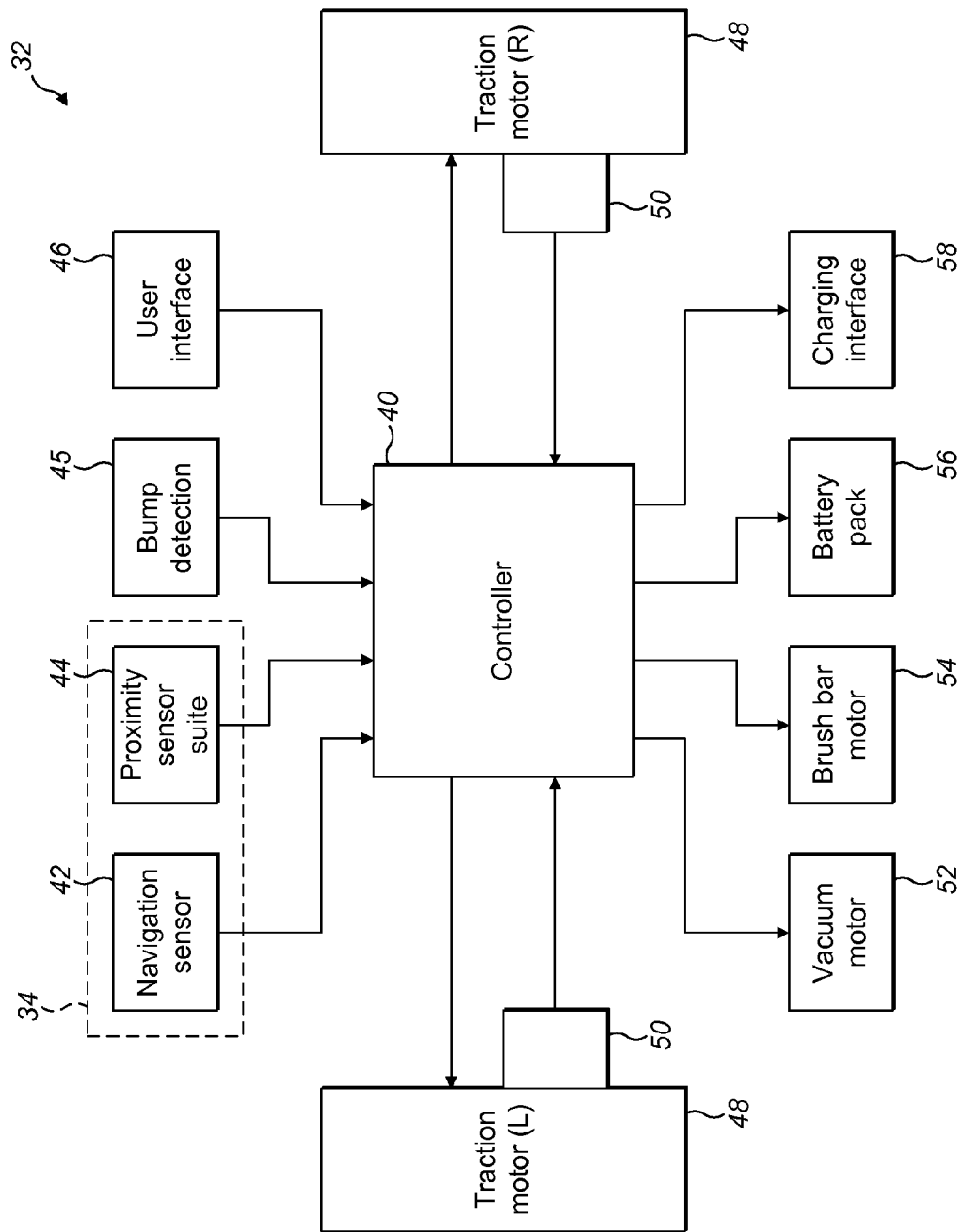
FIG. 3 is a system diagram of the electronic control system of the mobile robot.

FIG. 3 shows schematically a control system 32 of the robot 4 and its interfaces with the components described above. The control system 32 includes a controller 40 having appropriate control circuitry and processing functionality to process signals received from its various sensors and to drive the robot 4 in a suitable manner. The controller 40 is interfaced into a sensor suite 34 of the robot 4 by which means the robot 4 gathers information about its environment in order to map its environment and perform a cleaning route. The sensor suite 34 is also shown generally in FIG. 1 and includes a navigational sensor 42 for providing the robot 4 with a panoramic view of its surroundings, and also a near-field proximity sensing suite 44 to provide the robot 4 with the capability to detect obstacles. Finally, a bump detecting system 45 is provided although this is not illustrated in FIG. 1. It should be noted that navigation sensors, proximity sensors and bump detecting sensors are common components on mobile robots, particularly domestic robots. Therefore, the existence of such sensors on the robot 4 is provided here for completeness but they are not intended to form part of the invention.

A user interface 46 is provided in order for a user to command the robot 4 to start/stop a cleaning process, for example. The user interface 46 is also shown generally in FIG. 1. The user interface 46 may take various forms, such as one or more mechanical buttons or even a graphical user interface with touch screen technology.

The controller 40 is also configured to supply drive signals to traction motors 48 associated with the wheels and also to receive odometry data from the wheels. For this purpose suitable rotational sensing means 50 such as rotary encoders are provided on the traction motors 48.

Suitable power and control inputs are provided to suction motor 52 and brush bar motor 54. Finally, a power input is provided to the controller 40 from battery pack 56 and a charging interface 58 is provided by which means the controller 40 can carry out charging of the battery pack 56 when the battery supply voltage has dropped below a suitable threshold. It should be appreciated that the charging interface 58 is embodied by the electrical charging contacts 28, 30 provided on the underside of the robot 4.

The docking station 6 has been described in general terms above to place it in a suitable context. It's mechanical and electrical features will now be described in more detail with reference to FIGS. 4 to 12.

The docking station 6 comprises two major components: a base portion 60 and a back portion 62 that is pivotable with respect to the base portion 60. The docking station 6 is positionable by a user in a room and, typically, the user will choose to position the base portion 60 so that a rear edge of it is adjacent a wall, as is shown in FIG. 1. The back portion 62 is generally rectangular and substantially flat in this embodiment, although it will be appreciated that this is not essential and the back portion 62 may be shaped differently as long as it is able to fold against the base portion 60.

Figure 4:
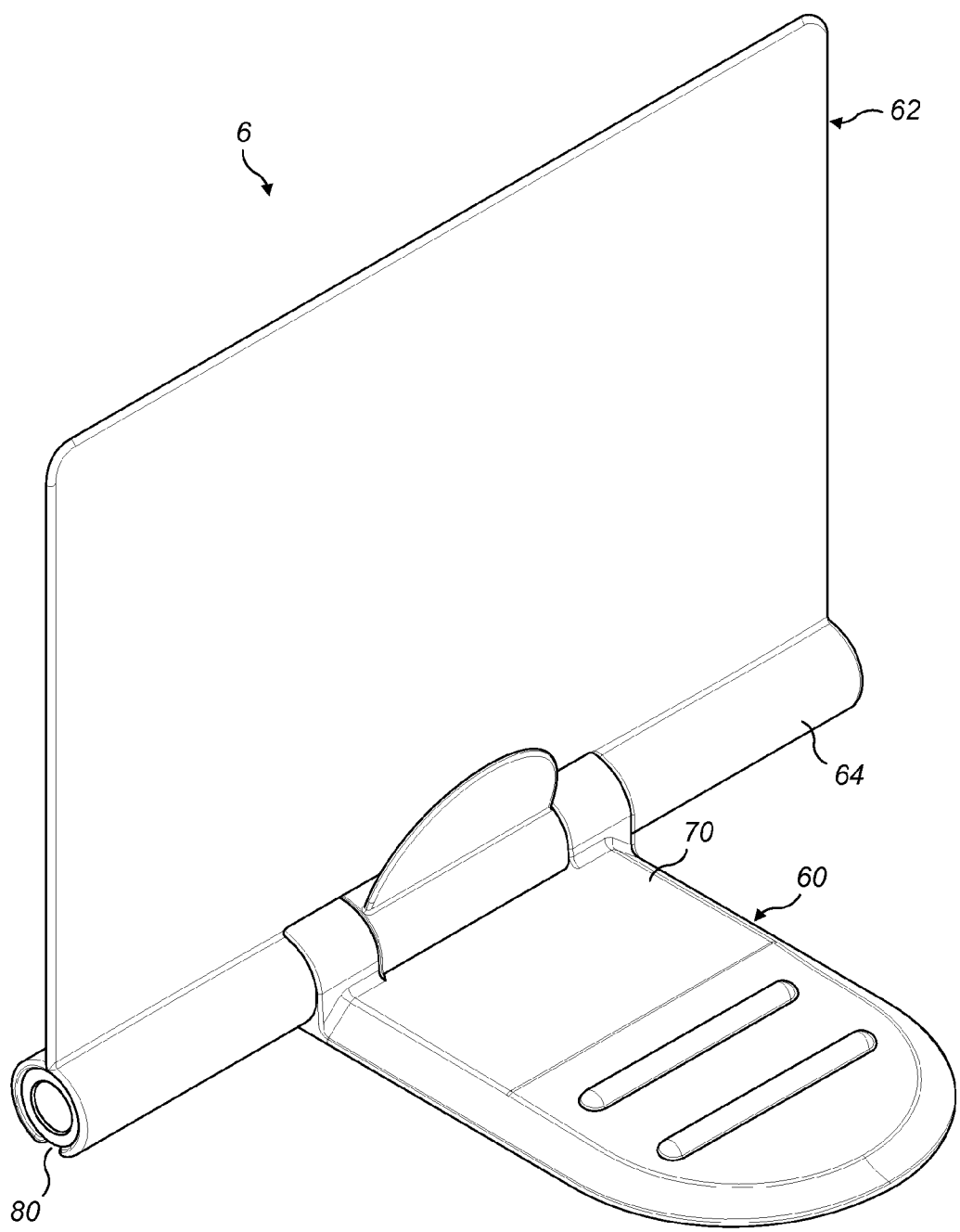
FIG. 4 is a perspective view of the docking station shown in FIG. 1—here the docking station is in a deployed condition.
Figure 5:
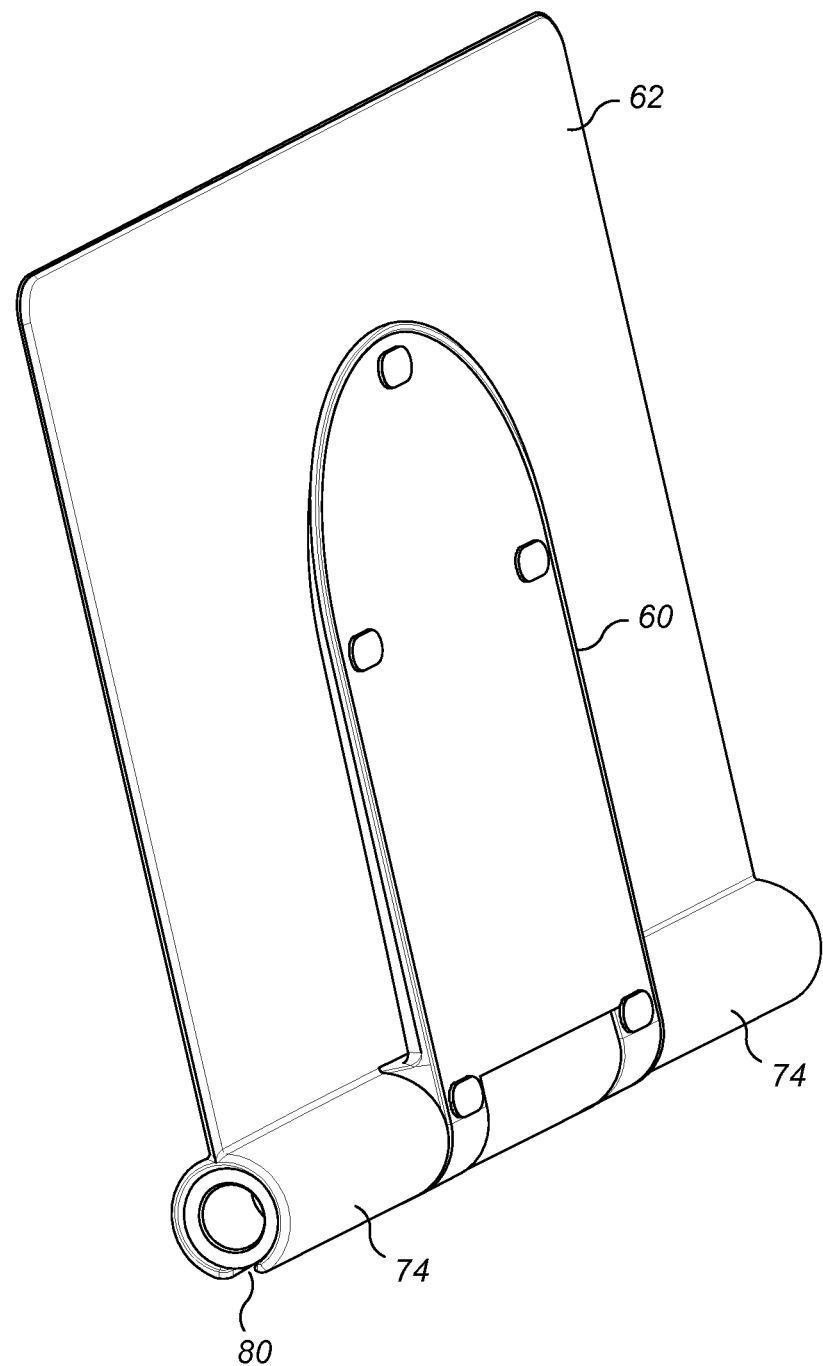
FIG. 5 is a perspective view of the docking station in a folded or 'stowed' condition.
Figure 6:
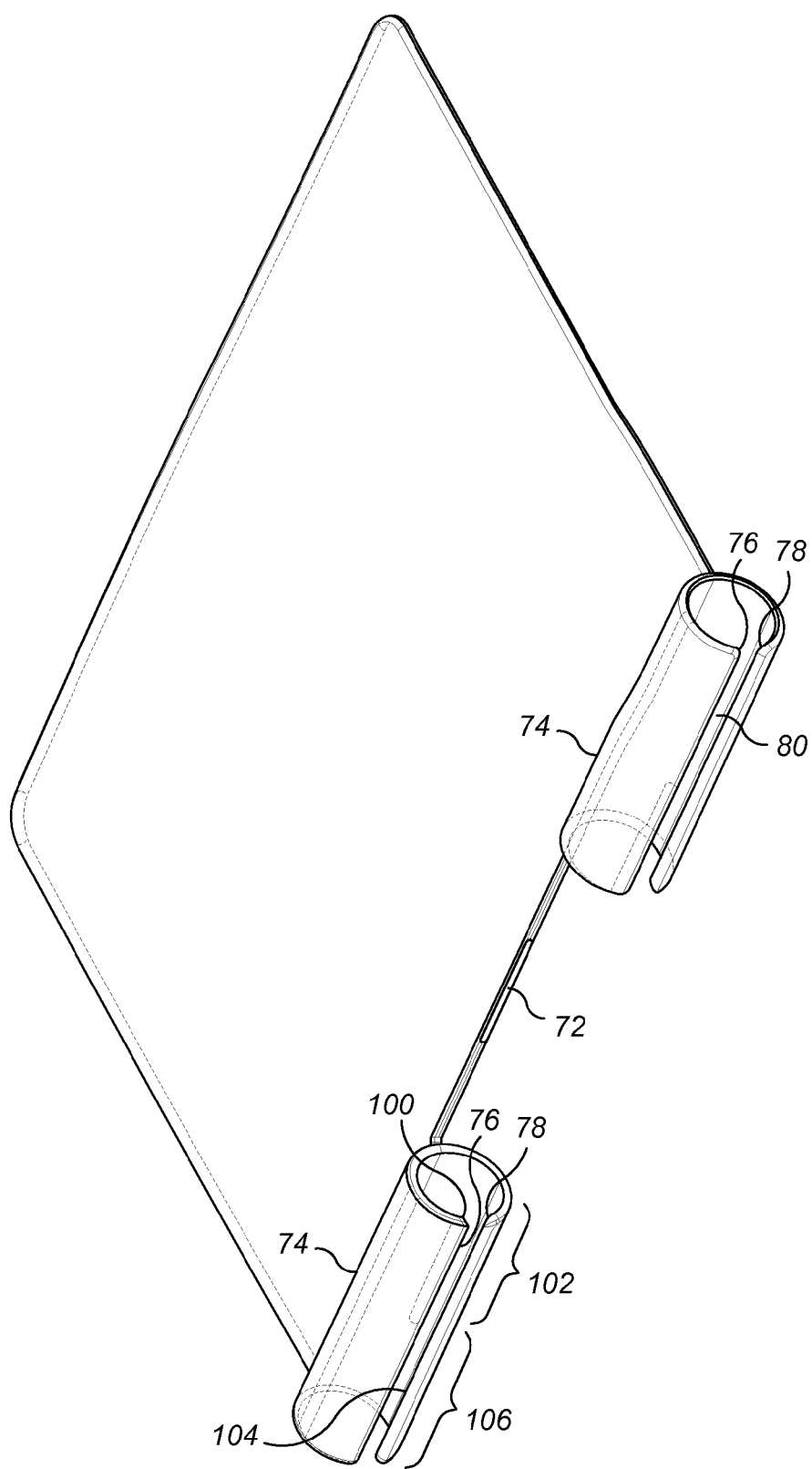
FIG. 6 is a perspective view of the back portion of the docking station separated from the base portion of the docking station.

As can be seen by comparing FIGS. 4 and 5, the docking station 6 is foldable in the sense that the back portion 62 is hinged with respect to the base portion 60. In this embodiment, the back portion 62 and the base portion 60 are relatively flat in form and this allows the two components to be pivoted between an unfolded or 'deployed' position (FIG. 4) and a folded or 'stowed' position (FIG. 5) in which the back portion 62 pivots through approximately 90 degrees so as to lie against the base portion 60, in which position they are substantially parallel. In the stowed position, therefore, the docking station 6 is has a low profile from the side and can readily be stored away if necessary, and it is also is a very efficient shape for transportation since it takes up minimal packaging volume.

In more detail, the base portion 60 includes an elongate rear portion 64 and a platform 70 that extends forwardly from the rear portion 64. The base portion 60 therefore takes the general form of a 'T' with the lateral bar of the T being the elongate rear portion 64 and the trunk of the 'T' being the forward platform 70.

The back portion 62 of the docking station is hinged to and is removable from the elongate rear portion 70 which thereby serves as a pivot region of the base portion 60. A long edge 72 of the back portion 62 includes first and second sleeves 74 that are spaced apart one at each end of the long edge 72. The sleeves are C-shaped in cross section such that a pair of opposed leading edges 76, 78 define a channel or slot 80 that faces away from the long edge 72 of the back portion 62. The channel 80 provides the sleeves 76, 78 with a degree of radial resilience so that the sleeve diameter can expand slightly in order to be mounted to the base portion 60 in a snap-fit action. The sleeves 74 thereby serve as a mounting interface that mates with a complementary interface provided by the elongate rear portion 64.

Figure 7:
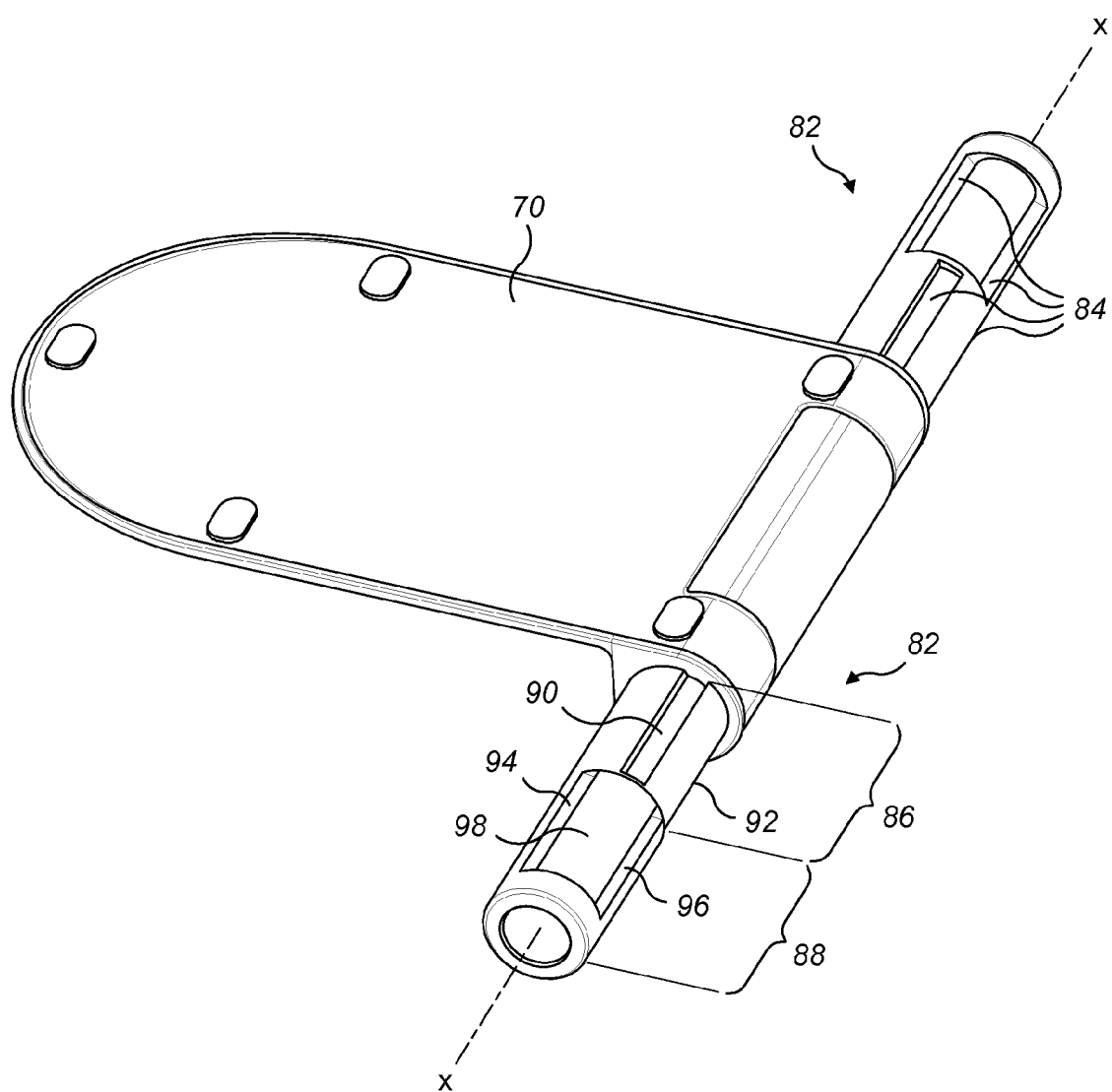
FIG. 7 is a perspective view of the base portion of the docking station in a partially disassembled condition that illustrates the pivoting mechanism provided on the base portion.

As shown in FIG. 7, the elongate rear portion 64 of the base portion 60 includes first and second pivot axles 82 that extend away from either side of the platform 70 and are aligned on a axis X. The pivot axles 82 are generally cylindrical and are dimensioned so as to receive the sleeves 76, 78 of the back portion 92 in a sliding fit. As the sleeves 74, 76 define a sliding fit around the pivot axles 82, this allows the back portion 62 to pivot with respect to the base portion 60.

In order that the back portion 62 is able to remain in the deployed condition once it is set, the pivot axles 82 includes detent means 84 that cooperate with the sleeves 76, 78. At this point it should be noted that the detent means 84 are identical on each of the pivot axles 82 so only one of them will be described in detail here for brevity, as illustrated in FIGS. 7, 8a-c and 9a-c.

The detent means 84 comprises longitudinal groove formations provided on inboard and outboard regions of the pivot axle 82. Note that for the purpose of this description, the inboard region is the section of the pivot axle 82 nearest the platform indicated generally as 86 and the outboard region is the section of the pivot axle 82 adjacent the inboard section but remote from the platform 70 indicated generally as 88. The groove formations in this embodiment are elongated and substantially straight although it should be appreciated that this is not essential.

In overview, the inboard region 86 includes first and second grooves labeled as 90 and 92 respectively and the outboard region 88 includes third and fourth grooves labeled 94 and 96, respectively. The outboard region 88 also includes a transition surface 98 that extends between the third and fourth grooves 94, 96. The grooves 90-96 complement engagement ribs provided on inboard and outboard regions 100, 102 of the sleeves 74 which are configured to mate with the grooves, as will be explained. The ribs can be seen in FIG. 6 such that a first rib 100 is provided on an inboard region 102 of one of the leading edges 78 of the sleeve 74 and a second rib 104 is provided on an outboard region 106 of the sleeve 74 on the opposed leading edge 76.

Figure 8A:
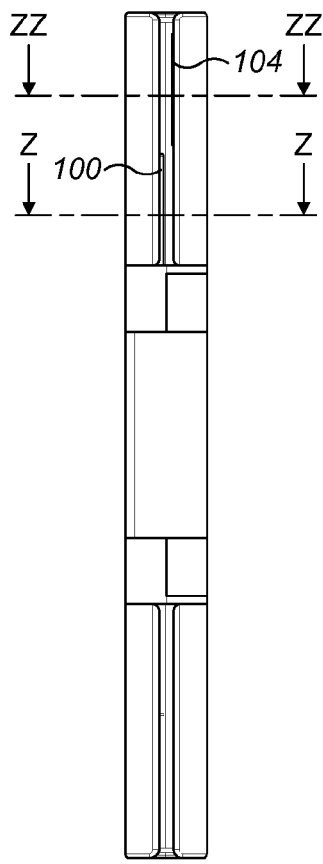
FIG. 8a is a view of the docking station in FIG. 5 from underneath such that the docking station is in a stowed condition.
Figure 8B:
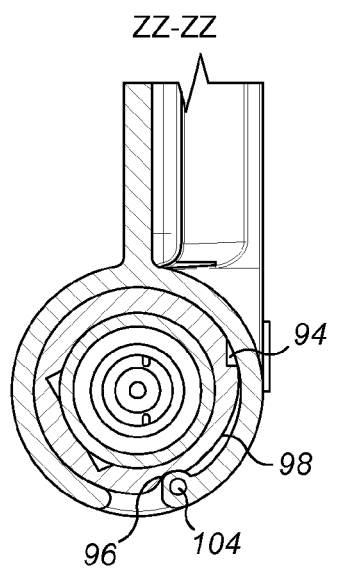
Figure 8C:
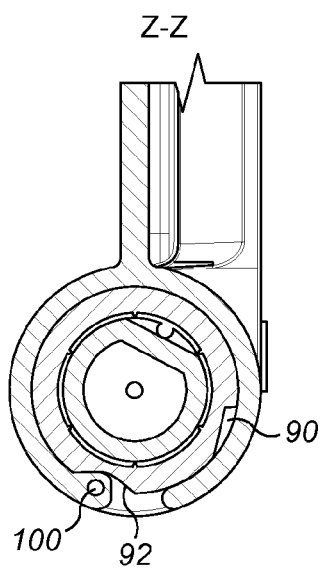

FIGS. 8a to 8c illustrate the engagement between the sleeve 74 and the pivot axles 82 when the back portion 62 is in the stowed condition. With specific reference to FIG. 8b, which shows a section through the outboard regions 88, 106 of the pivot axle 82 and sleeve 74, the second rib 104 is seated in the fourth groove 96. Similarly, with reference to FIG. 8c, which shows a section through the inboard regions 86, 102 of the pivot axle 82 and the sleeve 84, the first rib 100 is seated in the second groove 92. The second and fourth grooves 94, 96 therefore define a first set of grooves.

By virtue of the ribs 100, 104 being located in the second and fourth grooves 94, 96 the back portion 62 and the base portion 60 are held in a folded position quite firmly which guards against inadvertent deployment of the docking station. However, due to the radial resilience of the sleeve 72, the ribs 100, 104 are able to be released or 'bump out' of the grooves once a sufficient torque is applied to the sleeve 72 via a force applied to the back portion 62. Such an arrangement provides a positive feel to the stowed position. The skilled person would appreciate that the amount of force required is largely subjective although it would not be desirable to configure the groove formations so that too high a force was required to deploy the back portion 62. In practice, it has been found that a force of approximately 5N (Newtons)+/−2N applied to the upper edge of the back portion 62 provides a suitable amount of 'feel'.

Once the ribs 100, 104 have been released from the grooves 96, 92, the sleeve 72 is permitted to slide freely around the outer periphery of the pivot axle 82 toward a second set of grooves (the first groove 90 and the third groove 94) in which position the docking station 6 is in the deployed condition.

Figure 9A:
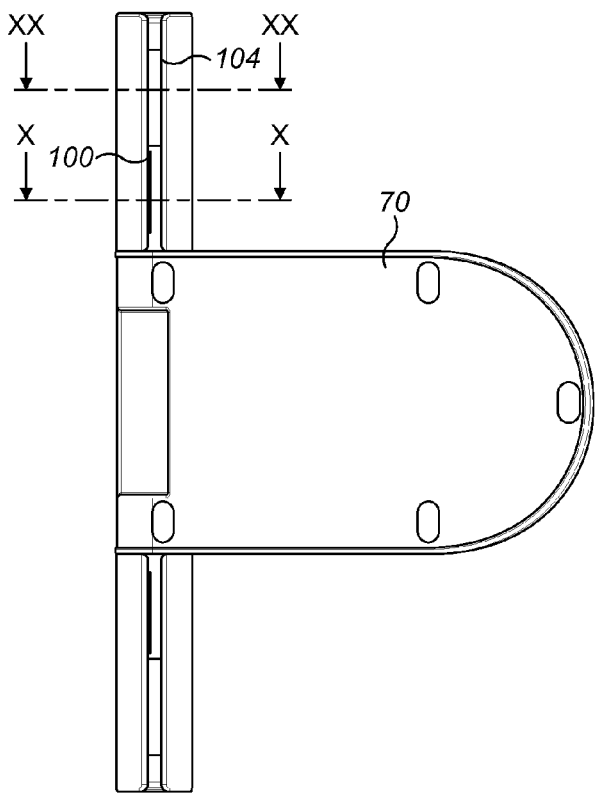
FIG. 9a is a view of the docking station in FIG. 4 from underneath such that the docking station is in a deployed condition.
Figures 9B, 9C:
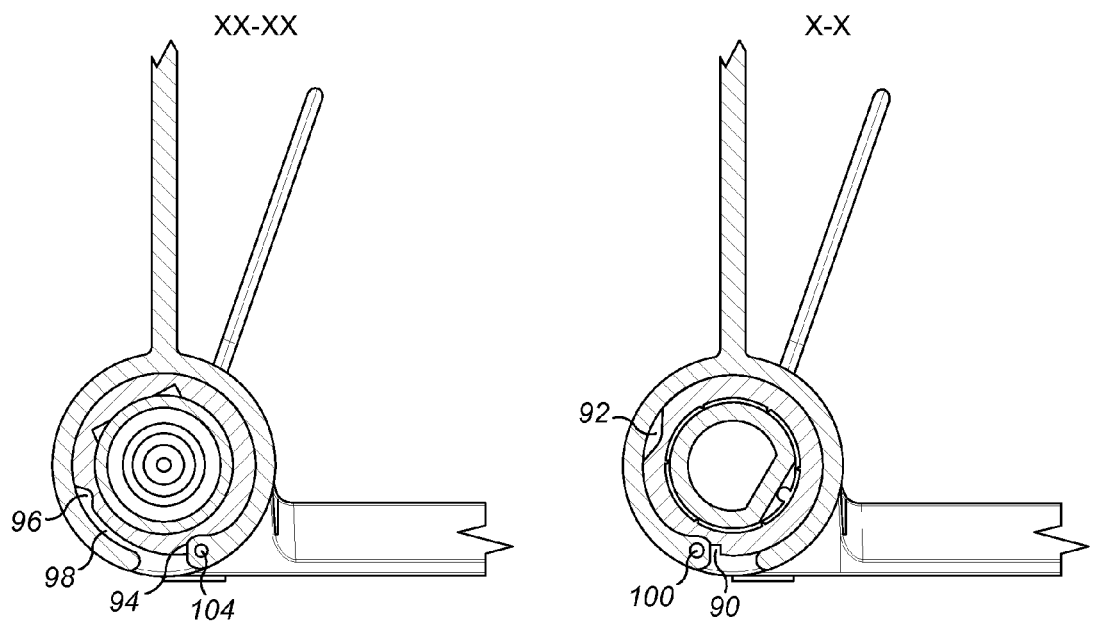

In this respect, FIGS. 9a to 9c illustrate the engagement between the sleeve 74 and the pivot axles 82 when the docking station is in the deployed condition. With specific reference to FIG. 9b, which shows a section through the outboard region 88 of the pivot axle 82 and outboard region 106 of the sleeve 74, the second rib 104 is seated in the third groove 94. Similarly, with reference to FIG. 9c, the first rib 100 is seated in the first groove 90.

By virtue of the ribs 100, 104 being located in the first and third grooves 90, 94, the back portion 62 and base portion 60 are held firmly in the deployed condition. However, in the same way that a predetermined force is required to free the ribs 100, 104 from the first set of grooves when in the stowed position, a predetermined force is also required to free the ribs 100, 104 from the second set of grooves in the deployed position. Such an arrangement provides a positive feel to the deployed position of the docking station and confirms to the user that it is in the correct position.

The transition region 98 provided on the outboard region 88 of the pivot axle 82 provides the user with a sense of 'feel' when transitioning the docking station 6 between stowed and deployed conditions. The transition region 98 can be seen in FIG. 7, and also in cross section in FIGS. 8b and 9b. The transition region 98 comprises a cam surface which extends between the fourth groove 96 and the third groove 94. As can be seen in FIGS. 8b and 9b the cam surface of the transition region 98 increases in diameter from the fourth groove 96 to the third groove 94 and terminates at the third groove 94. The effect of this is that the user will feel a gradual increase of resistance as the docking station 6 is moved into its deployed condition and the docking station will 'click' into place as the deployed condition is reached as the ribs 104 locate into the third grooves 94.

Figure 10:
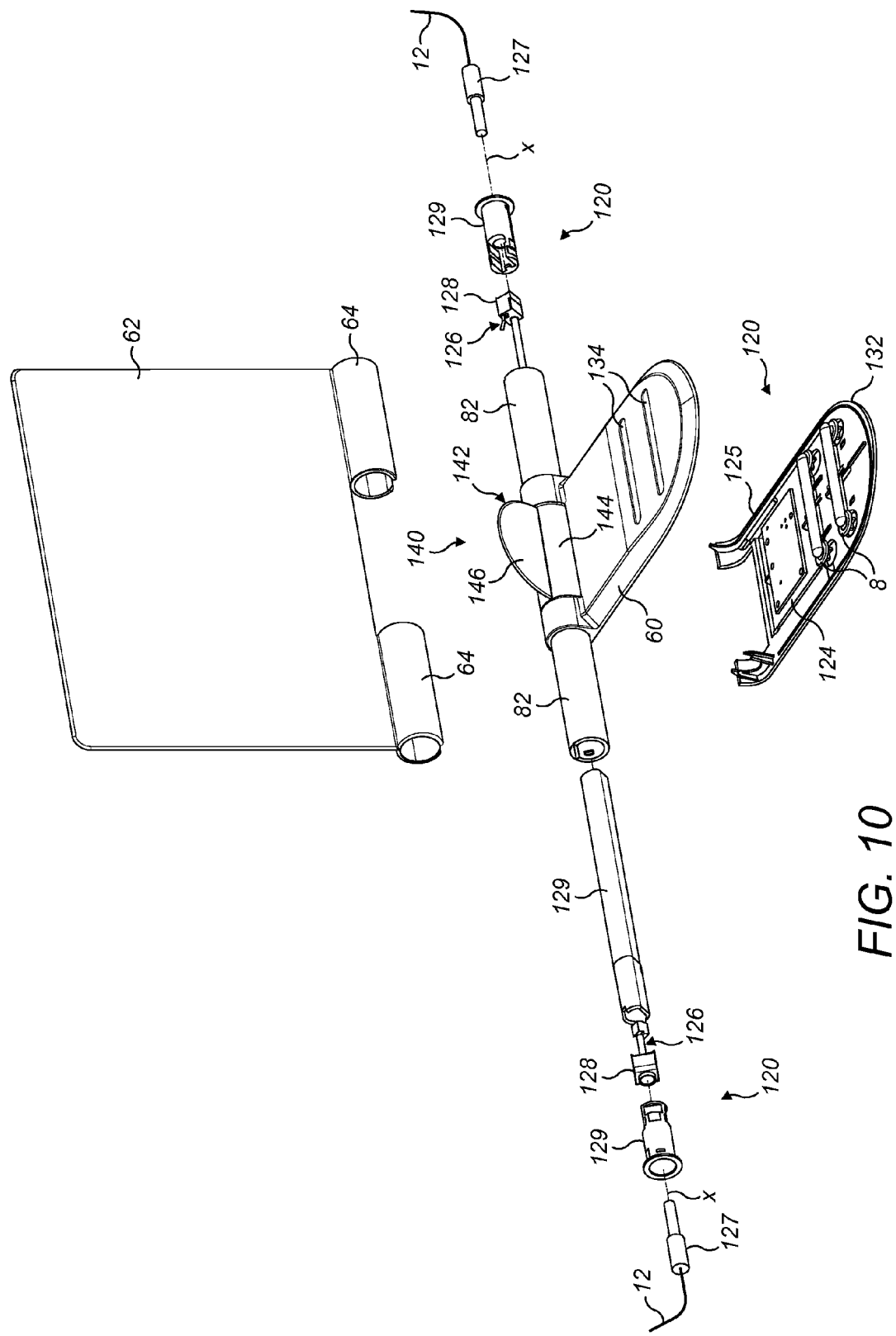
FIG. 10 is a partially exploded view of the docking station illustrating its electrical system.
Figure 11A:
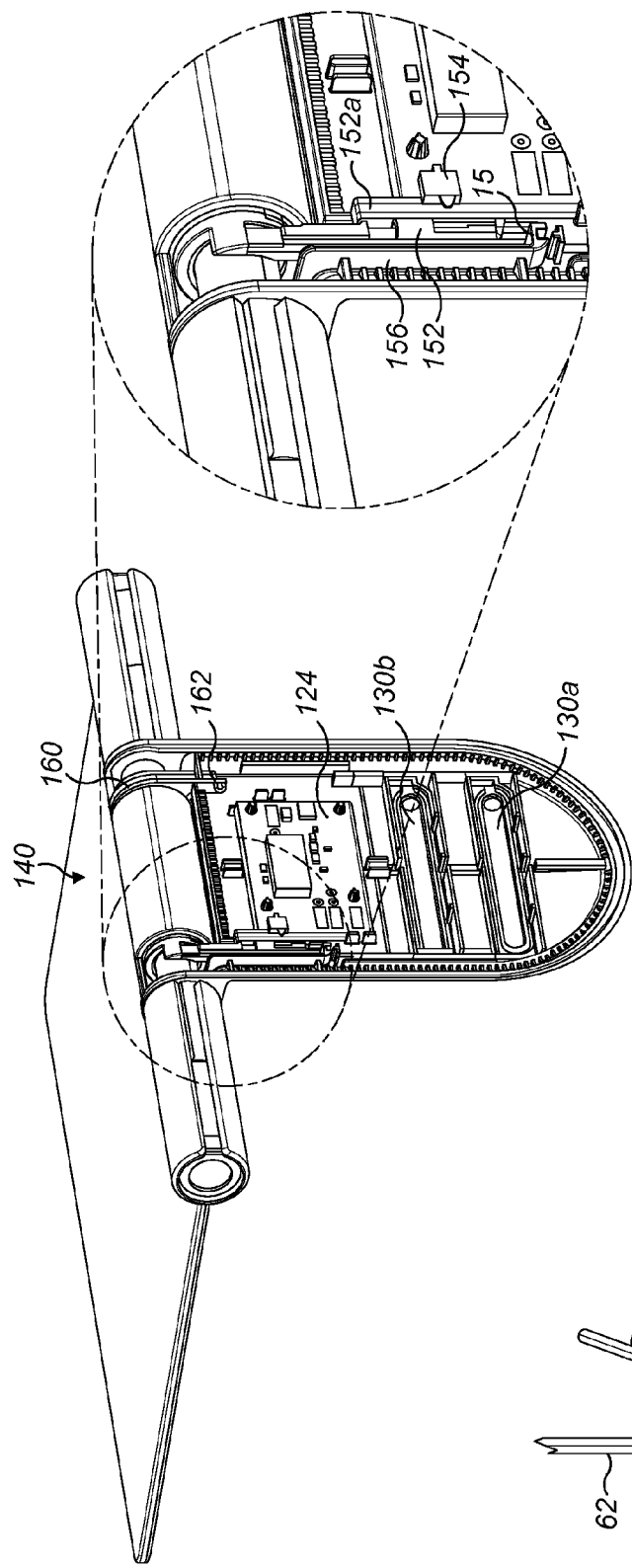
FIGS. 11a and 11b are views of the docking station which illustrate the position of the actuating mechanism in a 'power off' position.

The folding action of the docking station has been described above and attention will now turn to the electrical system of the docking station, with further reference to FIGS. 10, 11a, b and 12a, b.

As has been mentioned above, the primary function of the docking station 6 is to provide a means by which the robot 4 can recharge its on-board battery pack 56. In order to achieve this function the docking station 6 itself should be connectable to a source of power and should have a means to transfer charge to the robot 4 which, in this embodiment, is provided by the electrical contact means 8 as mentioned above. In this context, the base portion 60 houses an electrical charging system 120 of the docking station 6. In overview, the electrical charging system 120 comprises the electrical contact means 8, a power supply electronic board 124 and associated switching mechanism 125 and a power supply loom 126.

Power is supplied to the electrical charging system 120 by way of first and second power input sockets 128 provided on opposite side portions of the base portion 60. More specifically, the first and second power input sockets 128 are housed in the elongate rear portion 64 of the base portion 60. A tubular housing 129 of high strength acrylonitrile butadiene styrene (ABS) extends 129 through the pivot axles and provides a strengthened spine for the elongate rear portion 64. A polymeric material is preferred for efficiency of manufacture but it should be appreciated that other materials such as a tubular metallic material would also be acceptable.

The outer end of the pivot axles 82 are open so as to permit a power supply plug or jack 127 associated with the cable 12 to be inserted into either one of the sockets 128. Such an arrangement allows the positioning of the docking station 6 to be flexible. Since any given room in a dwelling, for example, only has a limited number of wall-mounted mains plug sockets, the user may be restricted to locating the docking station on a particular side of the power input sockets. If the docking station has only a single power input socket, the positioning of the docking station may mean that the power input socket faces away from the mains plug socket which would require an inconvenient routing of the mains power cable. Having a power input socket provided on both sides of the docking station avoids this.

In this embodiment, the power input sockets 128 are located on opposite sides of the docking station and are aligned along the axis X of the elongate rear portion 64. However, it should be appreciated that this is not essential and that the power input sockets 128 need not be axially aligned. The important factor is that a user is given more than one location to provide power to the docking station which makes the location of the docking station in a room more flexible.

The power supply loom 126 leads from the power input sockets 128 to the electronic board 124. Although not show explicitly in the Figures, the electronics board 124 contains all of the necessary circuitry to supply a suitable voltage and current to the robot 4 via the electrical contact means 8 when the robot 4 reaches a docked position.

The electrical contact means 8 comprises first and second electrically conductive power supply contacts 130a, 130b which are resiliently mounted to a lower housing part 132 of the base portion 60. In this embodiment, each of the supply contacts 130a, 130b are mounted on a pair of coil springs although it should be appreciated that other means of resiliently mounting the contacts are envisaged. For example, the contacts 130a, 130b could be mounted on leaf springs, resilient rubber buffers, fluid-filled cushions to name a few non-limiting examples. By virtue of the resilient mounts, the contacts 130a, 130b are urged upwardly away from the lower housing part 132 so that upper surfaces of the contacts protrude through openings 134 provided in the upper surface of the base portion 60. A force applied to the contacts 130a, 130b causes them to recede into the openings but this ensures that a positive electrical contact can be established between the robot contacts 28, 30 and the docking station contacts 130a, 130b. The contacts 130a, 130b are electrically conductive and in this embodiment are formed from pressed brass alloy having a nickel coating for durability purposes. However, other electrically conductive materials, metallic or otherwise, would be apparent to the skilled person.

In order to trigger the supply of power to the contacts 130a, 130b, the docking station 6 includes an activating mechanism 140 which is operable to move between on and off positions. The activating mechanism 140 therefore serves as a safety feature since the contacts 130a, b are not 'live' until the mechanism has been activated, as will now be described.

Figure 11B:
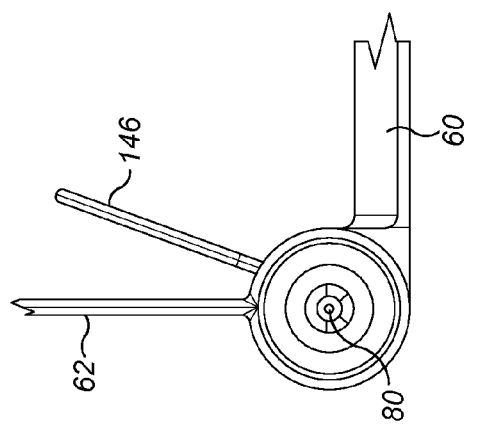
Figure 12A:
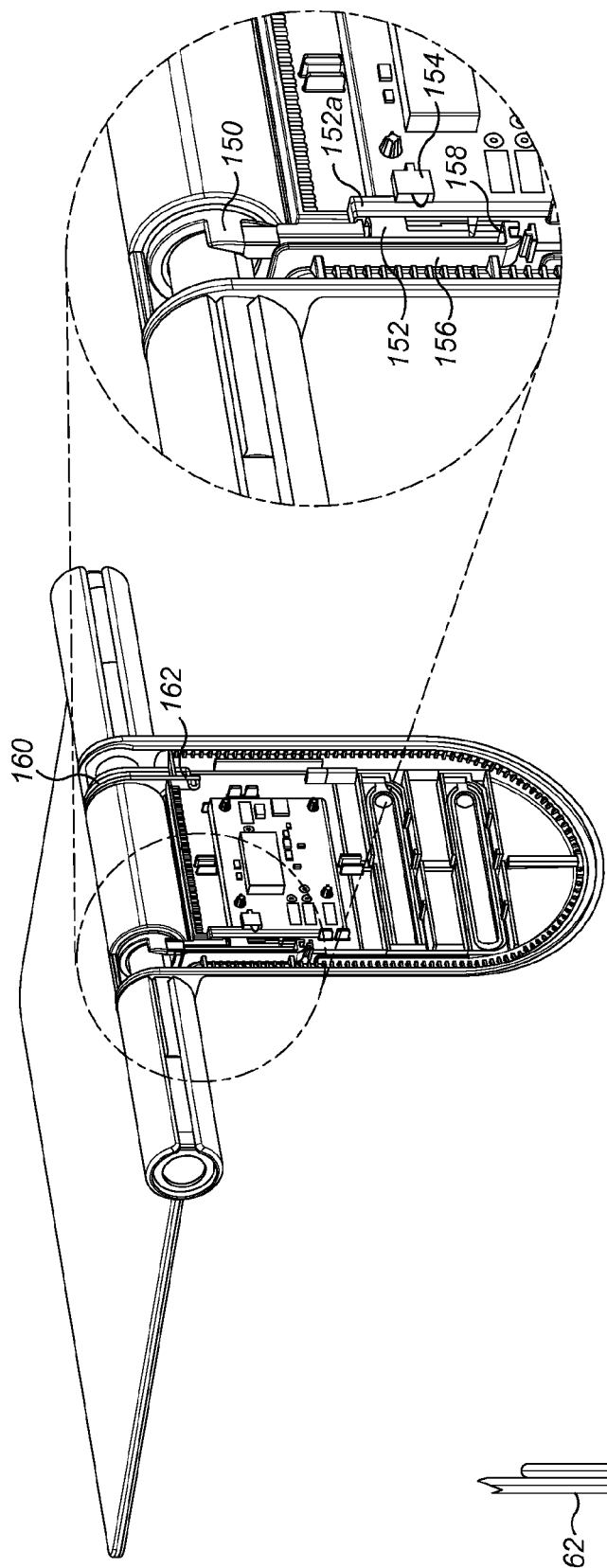
FIGS. 12a and 12b are views corresponding to FIGS. 11a and 11b but which show the actuating mechanism in a 'power on' position.
Figure 12B:
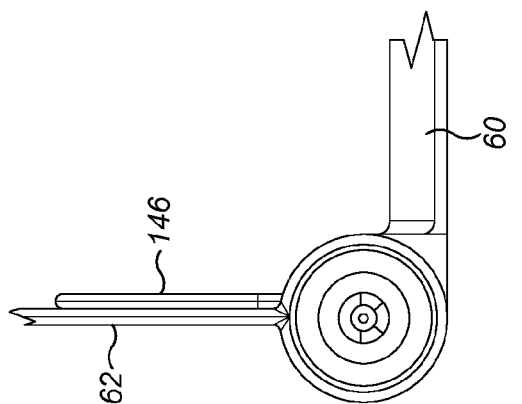

As shown in FIG. 10, the activating mechanism comprises a mechanically driven actuator 142 that is paddle-like in form. The actuator comprises tubular body 144 that is journalled in the gap between the pivot axles 82 and an operating lever 146 that extends away at an oblique angle from the body 144. Since the body 144 is journalled to the base portion 60 the lever 146 is able to move angular about the axis of the pivot axles 82 between first and second positions. The two operating positions of the actuator 142 are shown in FIGS. 11b and 12b. In FIG. 11b the actuator 142 is in an 'power off' position such that the contacts 130a, 130b are not supplied with power and in FIG. 12b, the actuator 142 has been moved angularly to that it abuts the back portion 62 and is in an 'power on' position such that power is supplied to the contacts 130a, 130b. It should be noted that the lever 146 will be pushed into the 'on' position when the robot has manoeuvred into an acceptable docking position.

The actuator 142 cooperates with the power electronics board 124 in order to control the flow of power to the contacts 130a, 130b. It should be appreciated here that the circuit board 124 is populated with components for illustrative purposes and they are not intended to be a precise and limiting representation. Suffice to say that the power electronics board 124 has the necessary components to relay the input power supplied at the input sockets 128 to a suitable output voltage at the electrical contacts 130a, 130b.

To this end, one option is for the power supply 12 attached to the electrical mains outlet 10 in the room to convert the mains voltage available at the outlet (UK: 240 VAC at approximately 13 A) to a suitable low value DC voltage for the docking station 6, for example between 15 and 20 VDC. The functionality of the electronics board 124 would therefore chiefly involve turning the power supply to the contact means 8 on and off as required which would simplify the electrical configuration of the electronics board 124 and this is currently considered to be preferable. Alternatively, the power supply 12 attached to the wall outlet 10 may be configured simply to connect the electronics board 124 directly to the mains outlet voltage so that the electronics board 124 would be required to convert the high value AC voltage to a suitable DC voltage for supply to the contact means 8. However, such functionality would require suitable power transformer and rectification circuitry thereby adding to the space requirement of the electronics board 124 and also would increase the power dissipation, which may not be desirable.

It should be noted that although not shown in the Figures, means may be provided in the power input sockets 128 and the associated power supply loom 126 to ensure that only one of the power supply sockets 128 can supply power to the electronics board 124 in the unlikely event of a user attempting to plug a power jack 127 into both power input sockets 128. In this embodiment, each of the power input sockets 128 includes a switch that activates to disable the opposing power input socket 128 in circumstances when a power jack 127 is inserted into the socket 128. The power input jacks 127 and the associated sockets 128 may be suitable 'off the shelf' parts—for example the power input jacks 127 may be supplied by Shen Miong Electron (Dong Guan) Co., Ltd. under part number 865-818 and the power input sockets 128 may be supplied by Technik Industrial Co., Ltd under part number TDC-091-PA662D-TS.

The activating mechanism further includes a tooth 150 located on the body 144 of the actuator 142 which acts against a slider 152 which, in turn, is engageable with a trigger switch 154 in the form of a miniature snap-action switch located on the power electronics board 124. The slider 152 includes an enlarged mid-section 152a that triggers and releases the microswitch 154 as the slider 152 is moved linearly to and fro within a channel 156 defined by the base position 60. The far end of the channel 156 defines an end stop 158 which serves as an abutment surface for a spring (not shown) which acts on the slider 152 to bias it in a position away from the microswitch 154.

In FIG. 11a, the activating mechanism 140 is in the 'off' position and it can be seen that the tooth 150 is in an angular position such that the slider 152 is retracted relative to the microswitch 154 so that the microswitch is not triggered. In this position, therefore, the contacts 130a, 130b are not electrically active. The position in FIG. 11a should be compared with FIG. 12a in which the tooth has moved angularly with movement of the lever 146 so as to push the slider 152 up the channel 156 thereby triggering the microswitch 154 so that the contacts 130a, 130b become electrically active.

In order that the activating mechanism returns reliably to its inactive state, a biasing means is provided which in this embodiment is in the form of a helical torsion spring 160 that is mounted against an end of the actuator body 144 and is braced against the body 144 and a retention point 162 on the housing 160.

The above discussion explains the manner in which the electrical contacts 130a, 130b are switched between inactive and active states through the robot 4 actuating the lever 146, which therefore serves as a safety interlock to ensure that a user cannot injure themselves through normal user of the robot. In order to actuate the lever 146, the robot 4 must be in an acceptable docked position, and the configuration of the contacts facilitates this, as the following discussion will make clear.

As has been explained above, the elongate contacts 130a, 130b have a length that extends in a direction transverse to the longitudinal axis of the base portion 60. In this embodiment, the length of each contact 130a, 130b is 60 mm and the width is approximately 5 mm, although it is to be understood that these dimensions are exemplary. It is important, however that at least one of the contacts, preferably the second contact 130b is elongate, that is to say longer than it is wide, in order to allow for lateral and angular misalignment between the robot and the docking station as will now be described. The significance of this technical aspect will now be explained with respect to FIGS. 13 and 14, FIGS. 15a,15b, and FIGS. 16a,16b. Here, the longitudinal axis of the robot 4 is indicated as L, the longitudinal axis of the base portion 60 is indicated as LL and the contacts 130a, 130b are aligned in parallel with a further axis T that is substantially perpendicular to the longitudinal axis LL, and parallel to the axis X of the elongate rear portion 64.

Figure 13:
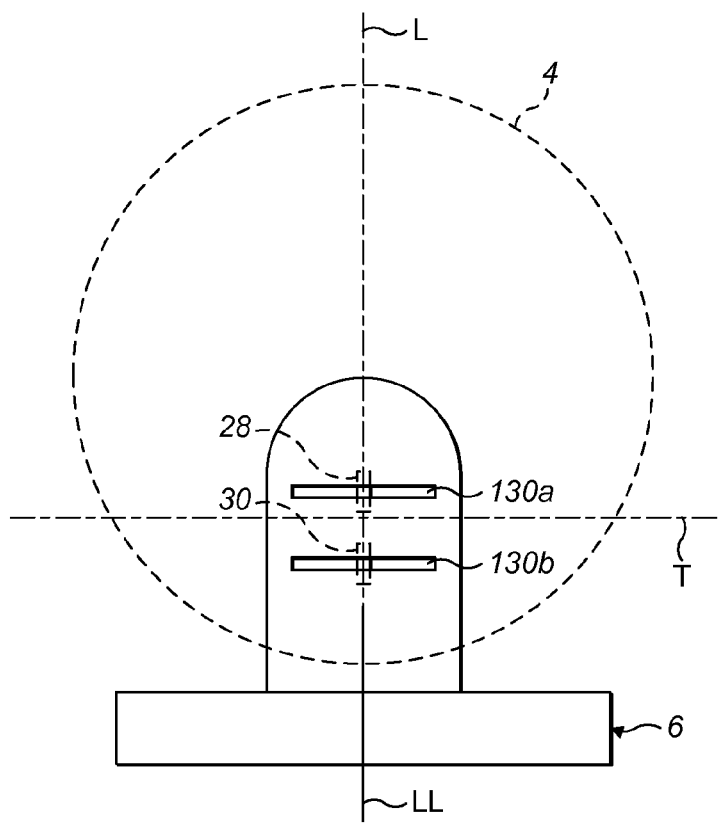
FIG. 13 is a schematic view of the robot overlaid on the docking station in a 'nominal' docking position.
Figure 14:
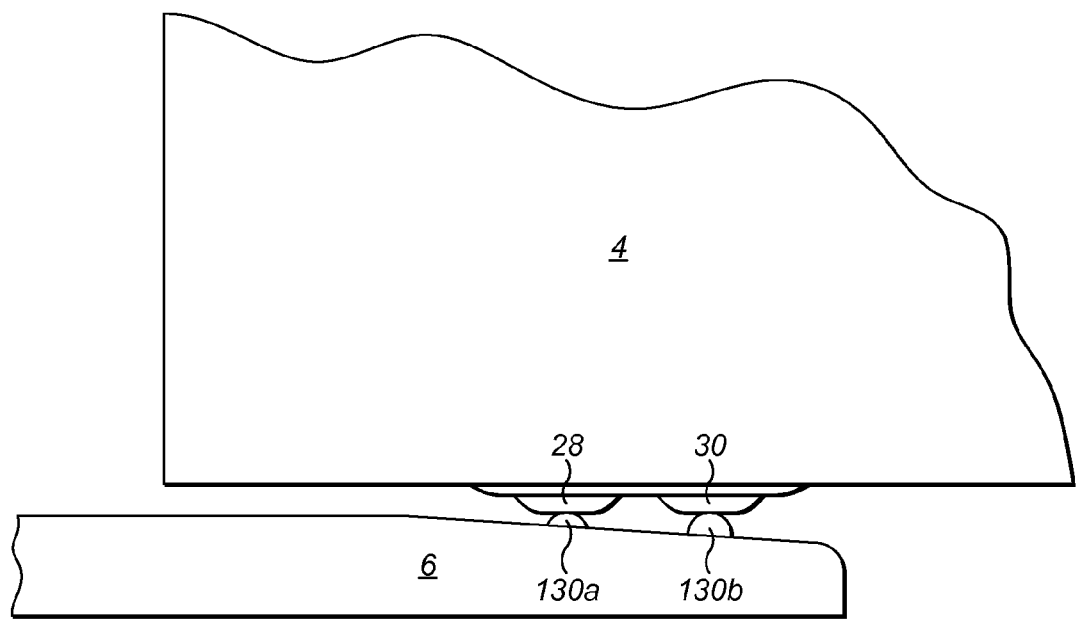
FIG. 14 shows a corresponding partial side view of the robot in simplified form which shows the electrical contacts of the robot and the docking station.

FIG. 13 shows the robot 4 docked with the docking station in a 'nominal' docking position. As can be seen the charging contacts 28, 30 of the robot 4 (and, therefore, also the longitudinal axis L of the robot) are aligned with the longitudinal axis LL of the docking station and therefore engage the electrical contacts 130a, 130b substantially at their midpoints. From another perspective, FIG. 14 show the spatial relationship between the robot 4 and the docking station 6 from the side, where it can be seen that the contacts 28, 30 on the robot 4 are touching the contacts 130a, 130b on the docking station 6 when the robot 4 is in a docked position.

The nominal docking position is an idealized position at which the robot 4 is able to dock with the docking station 6. In practice, the navigation system of the robot 4 may not be able to return it precisely to the nominal position. However, the transverse configuration of the electrical contacts 28, 30 of the robot 4 in relation to the orientation of the electrical contacts 130a, 130b of the docking station is such that a significant degree of misalignment between the robot 4 and the docking station 6 is permitted whilst still achieving a successful electrical contact between them.

Figure 15A:
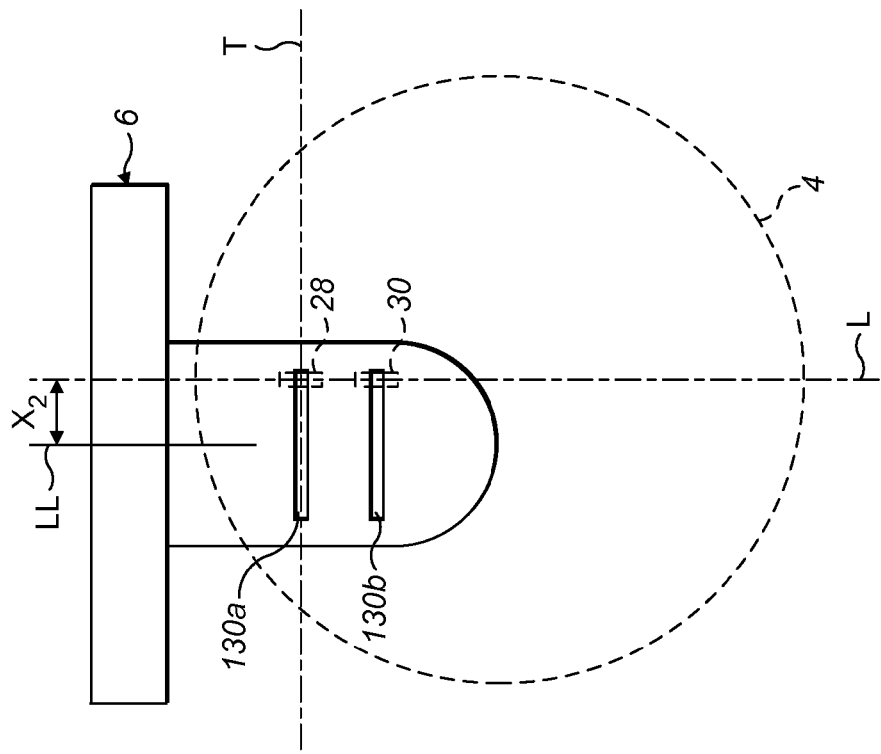
FIGS. 15a and 15b are schematic views like that in FIG. 13 but which show the robot in extreme lateral docking positions on the docking station.
Figure 15B:
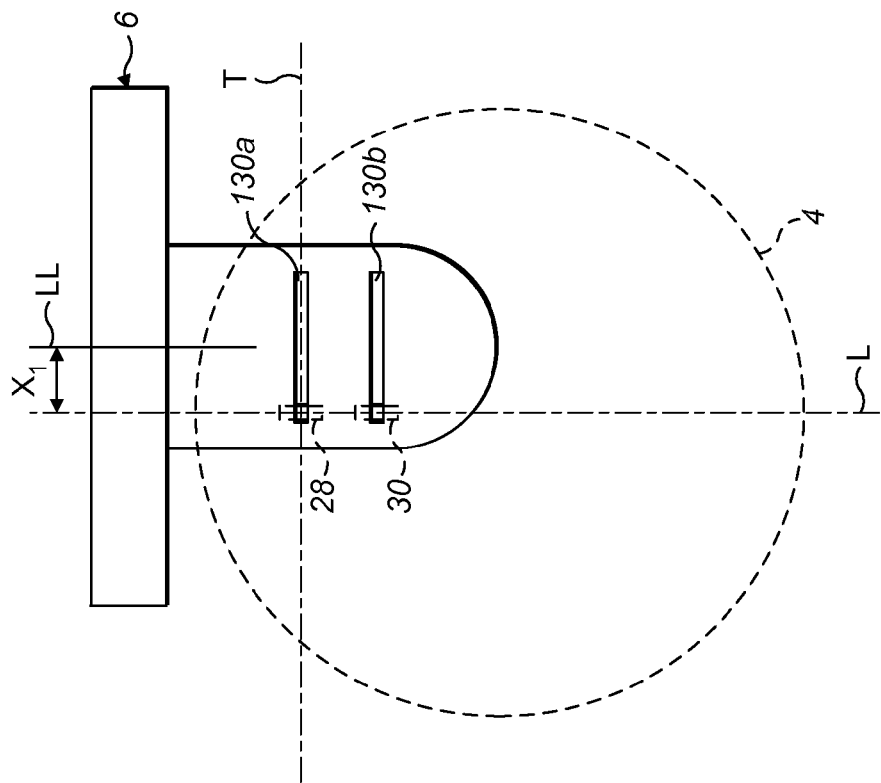

FIGS. 15a and 15b show two extreme laterally misaligned docking positions of the robot. In FIG. 15a, the robot 4 is positioned at a maximum left position and, as illustrated, the longitudinal axis L of the robot 4 is spaced to the left of the longitudinal axis LL of the docking station 6 by a distance $X_1$. In contrast, FIG. 15b shows the robot 4 positioned at a maximum right position and, as illustrated, the longitudinal axis L of the robot 4 is spaced to the right of the longitudinal axis LL of the docking station 6 by a distance $X_2$. It will be appreciated therefore, that the robot is able to dock with the docking station with a misalignment of up to $X_1+X_2$ whilst still achieving a successful electrical contact. A suitable distance for $X_1$ and $X_2$ is 30 mm although it should be appreciated that this is only exemplary and the contacts may be any suitable length.

As well as permitting a significant degree of lateral misalignment between the robot and the docking station away from the nominal docking position, the complementary configuration of the electrical contacts 28, 30 on the robot and the contacts 130a, 130b on the docking station 6 also permits significant angular alignment, as will now be described with reference to FIGS. 16a and 16b.

Comparing the position of the docking position of the robot 4 in FIG. 16a with the nominal docking position of the robot 4 illustrated in FIG. 13, it can be seen that the transverse orientation between the contacts 28, 30 on the robot 4 and the contacts 130a, 130b on the docking station 6 permits a significant angular misalignment in the anti-clockwise direction of at least $\theta_1$ degrees. Conversely, FIG. 16b shows that the traverse configuration of contacts will allow an angular misalignment between the robot 4 and the docking station 6 in the clockwise direction of at least $\theta_2$ degrees. It will therefore be appreciated that that the robot 4 is still able to dock electrically with the docking station 6 through a range of angular positions away from the nominal position as illustrated in FIG. 13. With the present embodiment, it is envisaged that the transverse configuration of the contacts will permit a total angular range of misalignment of between 10 and 30 degrees.

The benefit of this is that the navigation system does not have to function with pinpoint accuracy during the process of docking the robot 4 with the docking station 6. As is seen in the prior art, it is common for docking station to include directional beaming systems, using ultrasonics or infrared transmitters, that guide the robot towards a precise docking position on the docking station. Although such systems have the potential of being highly accurate, they add to the complexity and cost of the docking station and the robot. In contrast, in the robotic system of the invention, the navigation system is only required to maneuver the robot towards the docking station within a significant zone of lateral and angular misalignment and it will still achieve a successful electrical engagement with the docking station so that its internal batteries can be charged.

Some alternatives to the specific embodiments described above have already been explained. However, the skilled person will understand that other variations and modifications may be made to the specific embodiments without departing from the scope of the invention as defined by the claims.

In the specific embodiment described above, the back portion 62 is hinged to the base portion 60 by way of the two sleeves 74 that fit onto the associated pivot axles 82. Such an arrangement is technically advantageous since it does not require many parts to form the hinge and it is elegantly simple. Moreover, due to the snap-fit action of the components a user may disassemble and re-assemble the back portion 62 as desired. However, although such a hinged structure is preferred, the skilled person would appreciated that other hinge mechanisms would also result in the folding relationship between the back portion 62 and the base portion 60. For example the back portion 62 could be secured to a suitable bracket or brackets being pivotably attached to the base portion 60.

The robot of the invention has been described as using a rechargeable power source in the form of an internal battery pack. Of course, batteries are the most convenient form of rechargeable power source in such a robotic application but this does not rule out other forms of power sources being used such as large capacitive units for example.

Figure 17A:
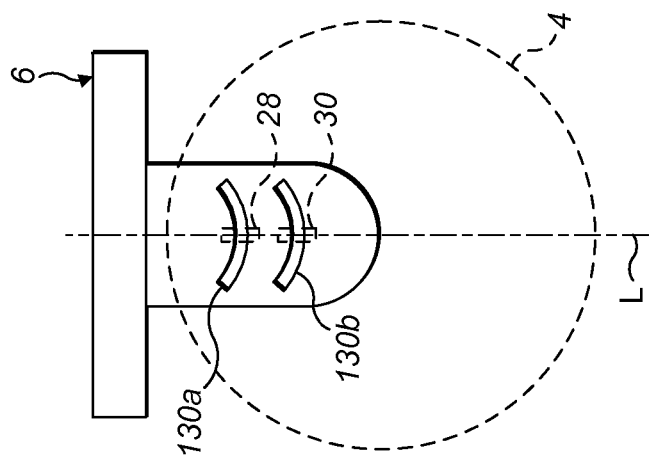
FIGS. 17a-c are schematic views similar to that in FIG. 13 which show alternative configurations of contact means on the docking station.
Figure 17B:
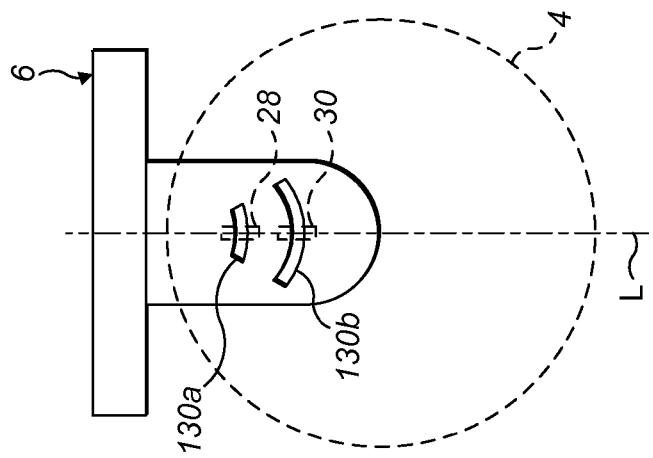
Figure 17C:
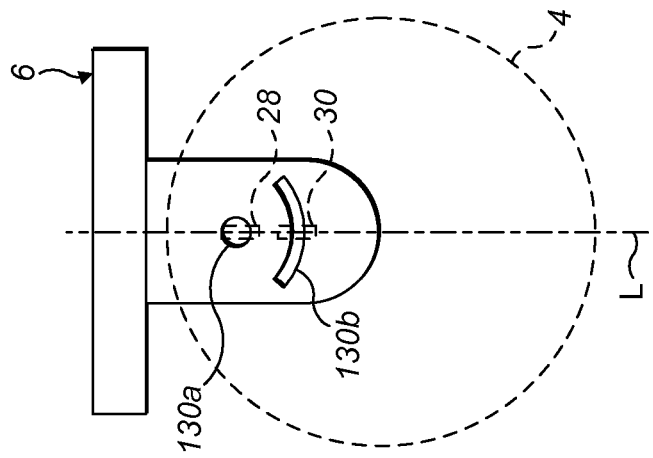

Although the electrical contacts 130a, 130b on the base portion 60 have been described as elongate, linear, and equal in length, other forms may be suitable. For example, instead of being linear, the contacts 130a, 130b may be curved or arcuate. Some examples of this are shown in FIGS. 17a, b and c. In FIG. 17a, both of the first and second contacts 130a, 130b are elongate but are curved. In this case each of the contacts 130a, 130b have substantially the same radius of curvature and subtend substantially the same degree of arc. Such a configuration may accommodate a wider range of angular misalignment between the robot 2 and the docking station 6 particularly when the robot is in a nominally central position laterally. In FIG. 17b, both of the contacts 130a, 130b are curved with substantially the same radius of curvature, but the first contact 130a is shorter than the second contact 130b such that it subtends a smaller degree of arc. An extreme example is illustrated in FIG. 17c in which the first contact 130a is not elongate and is in fact substantially circular whilst the second contact 130b is elongate and curved as in the previous examples.

Turning to the electrical contacts 28, 30 provided on the robot 2, although they have been described above as being aligned on a longitudinal axis L of the robot, it should be appreciated that the contacts 28, 30 may also be linearly aligned with each other but not aligned along the longitudinal axis L of the robot 2 but offset therefrom. Furthermore, each of the contacts 28, 30 may be offset from one another should this be desirable due to space constraints, and there may be more than two robot contacts 28, 30. For example a further electrical contact could be provided in order to serve to pick up an auxiliary electrical signal provided by a further electrical contact provided on the docking station, or the further electrical contact could be an electrical earth.

The activating mechanism 140 discussed above takes the form of a lever 146 that is pivotably mounted to the rear portion 64 of the docking station 6. Such a configuration provides a space-efficient solution to the problem of interlocking the supply of charging energy to the docking station contacts 130a 130b to the correct positioning of the robot 2 on the docking station. However, as an alternative to a pivoting lever, a linear travelling push rod (not shown) for example could be used to achieve a similar power interlocking function.

Although the above discussion has focused on a mobile robot having electrical contacts 28, 30 provided on its underside for cooperating with the electrical contact means 8 provided on the upper surface of the base portion 60 of the docking station, it should be appreciated that an equivalent affect would, in theory, be achievable if the electrical contacts 28, 30 of the robot were provided on its upper surface whilst the contact means of the docking station were provided on a surface that extended over the top of the mobile robot in order to establish communication with the robot's contacts 28, 30.

The invention claimed is:

1. A docking station for a mobile robot, including a first side and a second side and housing an electrical system having a power input, wherein the power input includes duplicate power input sockets with a first one of the duplicate power input sockets provided on the first side and a second one of the duplicate power input sockets provided on the second side.

2. The docking station of claim 1, wherein the first side and second side are on opposite sides of the docking station.

3. The docking station of claim 1, wherein the docking station has a rear edge and wherein the first power input socket and the second power input socket are located proximate the rear edge.

4. The docking station of claim 1, wherein the first power input socket and the second power input sockets are located in an elongate housing.

5. The docking station of claim 4, wherein the docketing station has a rear edge and wherein the first power input socket and the second power input socket are located proximate the rear edge, and wherein the elongate housing defines the rear edge of the docking station.

6. The docking station of claim 4, wherein each end of the elongate housing includes an aperture and wherein the first and second power input sockets are accessible through a respective one of the apertures.

7. The docking station of claim 4, including a back portion that is hinged to the elongate housing.

8. The docking station of claim 7, wherein the elongate housing is substantially cylindrical and wherein the back plate has a complementary-shaped mounting portion that clips onto the cylindrical housing.

9. The docking station of claim 4, wherein a base portion extends forwardly from the elongate housing.

10. The docking station of claim 9, wherein the base portion includes charging contacts.

11. The docking station of claim 9, including a mechanical interlock that is pivotably mounted to the elongate housing and is operable by docking of the mobile robot onto the base plate.

12. The docking station of claim 1, wherein the first power input socket includes an interlock that disables the second power input socket when an associated power supply plug is engaged in the first power input socket.

13. The docking station of claim 1, wherein the second power input socket includes an interlock that disables the first power input socket when an associated power supply plug is engaged in the second power input socket.

* * * * *